United States Patent
Wuchert et al.

(10) Patent No.: US 9,106,245 B2
(45) Date of Patent: Aug. 11, 2015

(54) METHOD FOR INTERFERENCE SUPPRESSION OF A SAMPLING PROCESS AND A DEVICE FOR CARRYING OUT THE METHOD

(71) Applicant: Robert Bosch GmbH, Stuttgart (DE)

(72) Inventors: Thomas Wuchert, Dermbach (DE); Matthias Kalisch, Filderstadt-Sielmingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/401,566

(22) PCT Filed: Mar. 25, 2013

(86) PCT No.: PCT/EP2013/056306
§ 371 (c)(1),
(2) Date: Nov. 17, 2014

(87) PCT Pub. No.: WO2013/170991
PCT Pub. Date: Nov. 21, 2013

(65) Prior Publication Data
US 2015/0116139 A1    Apr. 30, 2015

(30) Foreign Application Priority Data
May 16, 2012   (DE) .......................... 10 2012 208 261

(51) Int. Cl.
*H03M 1/10* (2006.01)
*H03M 1/06* (2006.01)
*H03M 1/12* (2006.01)
(Continued)

(52) U.S. Cl.
CPC .......... *H03M 1/0626* (2013.01); *H03M 1/1095* (2013.01); *H03M 1/1245* (2013.01);
(Continued)

(58) Field of Classification Search
CPC ............ H03M 1/12; H03M 2201/4233; H04L 25/03038; H04L 7/042; H04L 27/2647; H04L 5/0007; H04B 1/40
USPC .......... 341/120, 166; 375/350, 343, 346, 219; 370/343
See application file for complete search history.

(56) References Cited

U.S. PATENT DOCUMENTS

| 5,485,273 | A | 1/1996 | Mark et al. |
| 2010/0054098 | A1 | 3/2010 | Dunn |
| 2010/0097261 | A1* | 4/2010 | Chen et al. .................... 341/166 |

FOREIGN PATENT DOCUMENTS

| DE | 24 55 302 | 5/1976 |
| DE | 10 2011 007033 | 10/2012 |
| EP | 1 330 036 | 7/2003 |

OTHER PUBLICATIONS

Bilinskis I et al : "Digital Alias-Free Signal Processing in the GHz Frequency Range", IEE Colloquium on Advanced Signal Processing for MicrowaveApplications, Nov. 29, 1995, pp. 6/01-6/06, XP001133893, IEE, London, GB.

(Continued)

*Primary Examiner* — Joseph Lauture
(74) *Attorney, Agent, or Firm* — Kenyon & Kenyon LLP

(57) ABSTRACT

A method for interference suppression of a sampling process includes sampling an analog signal with a sampling frequency f, and determining whether an interference amplitude is present. The method provides that if an interference amplitude is present, the sampling frequency f is increased or decreased, and the method begins again with the sampling of the analog signal with the increased or decreased sampling frequency. In addition, a device is described for carrying out the method.

12 Claims, 3 Drawing Sheets

(51) Int. Cl.
*H03M 1/18* (2006.01)
*H04L 7/04* (2006.01)
*H04L 5/00* (2006.01)
*H04L 25/03* (2006.01)
*H04L 27/26* (2006.01)
*H04B 1/40* (2015.01)

(52) U.S. Cl.
CPC ............ *H03M1/183* (2013.01); *H03M 1/12* (2013.01); *H03M 2201/4233* (2013.01); *H04B 1/40* (2013.01); *H04L 5/0007* (2013.01); *H04L 7/042* (2013.01); *H04L 25/03038* (2013.01); *H04L 27/2647* (2013.01)

(56) References Cited

OTHER PUBLICATIONS

Sjef Van Rooij: "Digital Signal Processing: Kursteil 2: Abtasten und digitale Filtertechnik", Elektor, Feb. 1, 1998, pp. 66-70, XP002697900, Germany.

Michael Hartkopf: "Ditigale Audiosignale, Teil 1", Funkschau, Feb. 1, 1997, p. 2pp, XP002697901, Germany.

Michael Hartkopf: "Ditigale Audiosignale, Teil 2", Funkschau, Apr. 1, 1997, p. 2pp, XP008163400, Germany.

\* cited by examiner

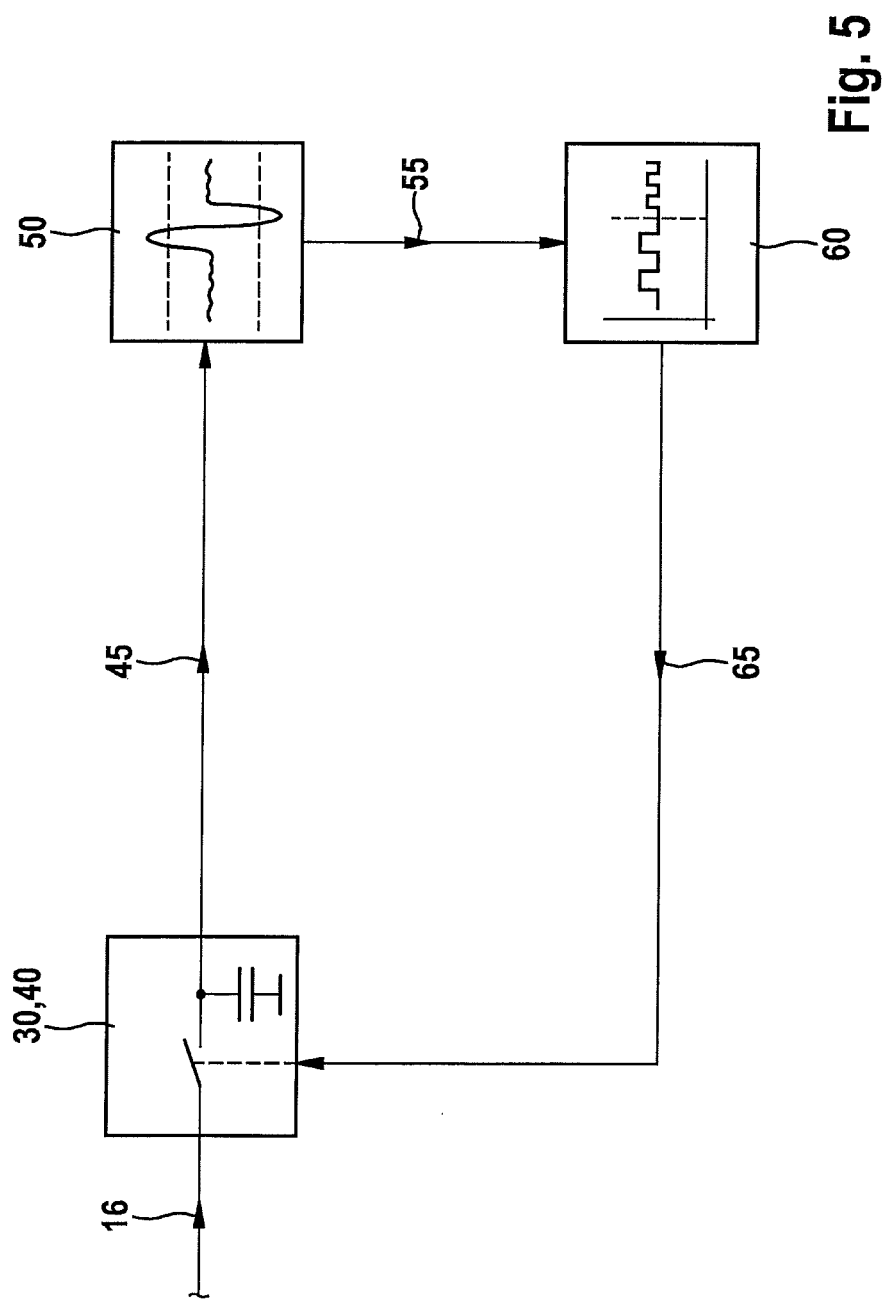

METHOD FOR INTERFERENCE SUPPRESSION OF A SAMPLING PROCESS AND A DEVICE FOR CARRYING OUT THE METHOD

FIELD OF THE INVENTION

The present invention relates to a method for interference suppression of a sampling process, in which, as a function of the presence of a particular type of interference in the base band of a sampled and analog-digital-converted signal, a successive modification of the sampling frequency is carried out.

BACKGROUND INFORMATION

For the digital evaluation of the measurement results of sensors, it is necessary to convert the analog sensor signal, or the signal sampled by sensors, into a digital signal. Frequently, for this purpose analog-digital converters are used, which make use of the advantages of an oversampling. Here, the narrow-band input signal is sampled with a high-frequency clock rate, and is subsequently digitized using an analog-digital converter. The bandwidth of the useful signal (also referred to as useful band or base band) is here significantly smaller than half the sampling frequency. If the input signal contains high-frequency interference signals, these may be convoluted down into the useful band due to the aliasing effect. In order to prevent this, standardly an anti-aliasing filter is used that filters out the high-frequency interference signals before the sampling.

FIG. 1 schematically shows a frequency diagram for such a situation. Analog useful signal 16 is sampled with a sampling frequency f. In an idealized circuit, or an idealized method, this takes place for example using a periodic clock signal having the period T=1/f, a sampled value being acquired in each case at a determined point in time within the period, for example when the periodic clock signal exceeds or falls below a specified voltage, so that the temporal distance between two successive sampling times corresponds in each case to the period T. The sampled useful signal then results, in the time representation, as the product of the input signal times a sampling function that is given by a sequence of equidistant sampling pulses with the temporal spacing T. In the frequency representation, this product corresponds to a convolution of the frequency spectrum of the input signal with the frequency spectrum of the sampling function, given by a sequence of equidistant spectral lines with the spacing f. Frequency spectrum 10 of a sampling function is shown in FIG. 1.

The input signal can contain superposed high-frequency interference signals, such as those that occur for example in the case of electromagnetic coupling in. According to the existing art, such an interference signal is filtered out before the sampling using an anti-alias filter, for example a low-pass filter having transmission function 14. Such a filtered high-frequency interference signal 12 is shown in FIG. 1 as an example, at a frequency that is slightly greater than twice the sampling frequency f. The point of intersection of transmission function 14 of the anti-aliasing filter with the frequency axis limits base band 1 to a range that extends from 0*f up to a frequency of f/2. Here, the low-pass filter is fashioned such that an analog useful signal 16 in base band 1 is allowed to pass through as unfiltered as possible at a typical useful frequency. A disadvantage of this solution is that an anti-aliasing filter has to be implemented. This results in development outlay and use of surface area, in particular if an application-specific integrated circuit (ASIC) is realized.

FIG. 2 shows the frequency spectra of the sampling of an analog useful signal 16 without anti-aliasing filter. Base band 1 extends, as in the case of the filtering using an anti-aliasing filter, over a frequency range of from 0*f to f/2. However, interference amplitude 20, which represents the convolution of an unfiltered high-frequency interference signal 18 in the case of sampling without the use of the anti-aliasing filter, is for the most part convoluted directly into base band 1 and thus, given sampling with a sampling frequency f whose frequency spectrum 10 in FIG. 2 is depicted as equal to that in FIG. 1, is wrongly interpreted as useful signal 16.

In the article "Digital Alias-free signal processing in the GHz frequency Range" by I. Bilinksis, G. Cain, published in 1996, pages 6/1-6/6 (XP1133893), the authors discuss a sampling method freed from aliasing, in which the sampling times are shifted in time by an arbitrary amount of time with respect to a periodic sampling.

Furthermore, U.S. Pat. No. 5,485,273 discusses a resolution system reinforced by a ring laser gyroscope, in which a phase-locked loop circuit used for sampling frequency modulation is used in combination with a fast filter.

Moreover, EP 1 330 036 A1 discusses a method and a device for alias-suppressed digitization of analog signals of a high frequency, in which a clock pulse generator generates a sequence of electrical pulses of a predetermined frequency $F_{clk}$, the sequence being divided by a pseudo-arbitrary value for the purpose of selecting a pulse from the sequence.

SUMMARY OF THE INVENTION

According to the present invention, a method is provided for interference suppression of a sampling process, the method including the method steps of sampling an analog signal with a sampling frequency f, and of determining whether an interference amplitude is present. The method furthermore includes the step of an analog-digital conversion of the sampled signal, an interference amplitude being determined to be present, in the method step of determining whether an interference amplitude is present, only if it is greater than the noise of an analog-digital conversion performed in connection with the method.

An interference amplitude is present only if the interference amplitude is present in the base band of the frequency spectrum of a sampled useful signal, the base band extending across a frequency range from 0 f to f/2. When an interference amplitude is present, sampling frequency f is increased or decreased, and the method begins anew with the method step of sampling the analog signal at the increased or decreased sampling frequency. According to the present invention, the step of increasing or decreasing the sampling frequency f occurs successively by a predetermined constant absolute value Δf, in a direction having always the same sign, up to a threshold value $f_g$. In other words, if an interference signal is present, sampling takes place with a new, increased or decreased, sampling frequency. In the other case, sampling continues with the original sampling frequency f.

The advantage of such a method is that, given an analog-digital conversion that does without an anti-aliasing filter, a high-frequency interference signal is no longer convoluted into the base band, but rather into a frequency range that is outside the base band. Thus, the analog-digital-converted useful signal, due to the simple changing of the sampling frequency, can be correctly interpreted, and thus the use of an anti-aliasing filter can be omitted. This can save costs and space in the implementation of an analog-digital converter. In addition, when an anti-aliasing filter is used there is also an undesired attenuation of the useful signal, while not all frequency portions that continue to cause aliasing effects can be suppressed by the anti-aliasing filter. These disadvantages can also be avoided through the use of the method according to the present invention.

In this way, the noise of an analog-digital conversion, applied in the context of the method, that is insignificant for the interpretation of the useful signal is excluded as a trigger for a modification of the sampling frequency. Through this, the method gains in efficiency, because a modification of the sampling frequency is carried out only when the interpretation of the useful signal is impaired by a high-frequency interference signal or interference amplitude.

In this way, the method is initiated only when the interfering signal has an effect in the useful band of the frequency range; this increases the efficiency of the method.

Through this deterministic modification of the sampling frequency, the effect of the method on a high-frequency interference signal can be better determined, or more precisely regulated, because the modification of the sampling frequency takes place in linear fashion, i.e. in equidistant steps. Through the limitation, via threshold value $f_g$, of the possible modification of the sampling frequency, it can be ensured that the method is not carried out beyond a range in which it makes sense to carry it out, thus preventing an addition of noise to the useful signal in the base band.

In a development of this specific embodiment, $\Delta f$ is formed according to the following rule containing threshold value $f_G$: $f_{increased/decreased} = f + \Delta f$, where $\Delta f = (f_g - f_{1,0})/n$, $n \in Z$, and $f_{1,0}$ is the initial sampling frequency.

In a development of this specific embodiment, threshold value $f_G$ is defined by the value of the aperture jitter of a sample and hold circuit used in the sampling process. In this way, the maximum possible threshold value $f_g$ is selected for the method, providing the widest range of play for a modification of the sampling frequency.

In a specific embodiment, threshold value $f_G$ corresponds to at most the initial sampling frequency increased or decreased by 5%.

In a specific embodiment, threshold value $f_G$ corresponds to at most the initial sampling frequency increased or decreased by 1%.

In particular, n is selected from a subset of the whole numbers M, where $M \in [1, 20]$. When parameter n is chosen in this way, the number of possible modification steps is limited to a number of steps that is advantageous to realize in terms of circuitry. Still more particularly, $M \in [2, 10]$.

In addition, a device is provided that includes a clock pulse generator that is configured to produce a periodic clock signal and to modify the period of the periodic clock signal upon reception of a control signal. In addition, the device includes a sampling unit that is configured to use the periodic clock signal for the sampling of an analog useful signal and to produce a sampled useful signal. In addition, an analog-digital converter is configured to convert the sampled useful signal into a digital useful signal.

A unit for determining an interference amplitude is configured to determine whether the digital useful signal is affected by an interference amplitude. An interference amplitude is determined to be present only if it is greater than the noise of the performed analog-digital conversion and if the interference amplitude is present in the base band of the frequency spectrum of the sampled useful signal, the base band extending across a frequency range from $0*f$ to $f/2$. In the event of the presence of an interference amplitude, the unit for determining an interference amplitude generates a control signal and supplies it to the clock pulse generator in such a way that a change in the sampling frequency f in the sampling unit occurs successively by a predetermined constant absolute value $\Delta f$, in a direction having always the same sign, up to a threshold value $f_g$.

Exemplary embodiments of the present invention are explained in more detail on the basis of the drawings and the following description.

BRIEF DESCRIPTION OF THE DRAWINGS

FIG. 5 shows the design of a specific embodiment of a device for carrying out the method according to the present invention.

DETAILED DESCRIPTION

Figure 1:
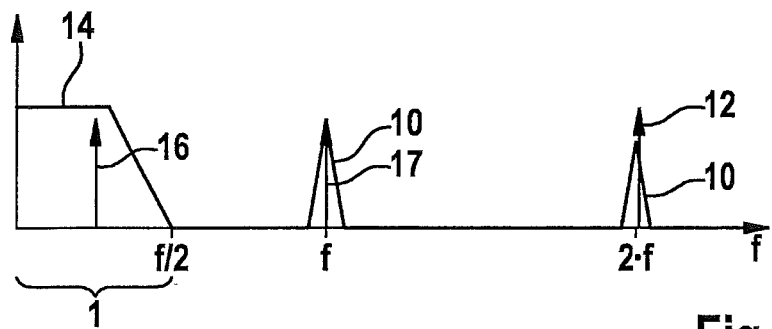
FIG. 1 shows the frequency spectra of the sampling of a useful signal using an anti-aliasing filter known from the existing art.
Figure 2:
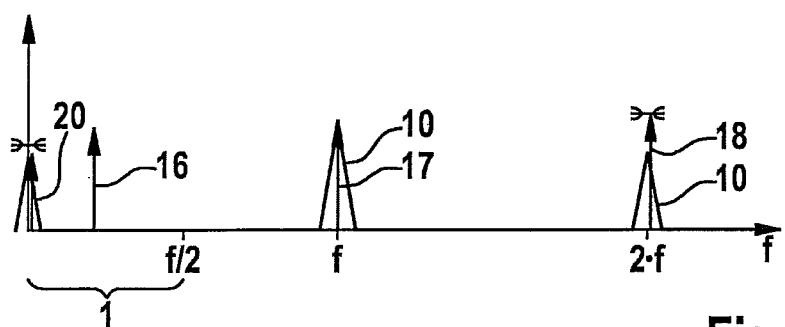
FIG. 2 shows the frequency spectra of the sampling of a useful signal without the use of an anti-aliasing filter from the existing art.
Figure 3:
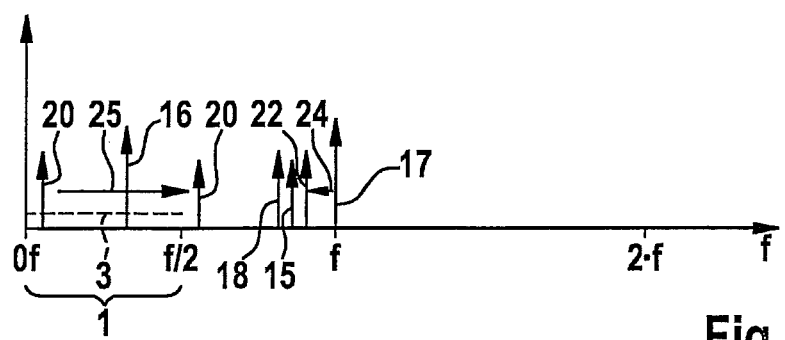
FIG. 3 shows the frequency spectra of a specific sampling of a useful signal using the method according to the present invention.

In FIG. 3, the frequency spectra are shown of a specific sampling of a useful signal using the method according to the present invention. Base band 1 extends over the frequency range from 0 f to f/2. An analog useful signal 16 is sampled with a first sampling frequency 17. If interference amplitude 20 of a high-frequency unfiltered interfering signal 18 is present, this interference amplitude 20 is recognized in the course of the method according to the present invention. A modification 24 of sampling frequency 17 to an increased or decreased sampling frequency 22 is then carried out in accordance with the method, and the method is restarted (not shown) with the increased or decreased sampling frequency 22, with the method step of sampling analog signal 16.

An interference amplitude 20 is recognized only if this amplitude is greater than the noise 3 of an analog-digital conversion carried out in the course of the method, and interference amplitude 20 additionally comes to be situated in base band 1. Interference amplitude 20 is recognized and, in the present exemplary embodiment, sampling frequency 17 is decreased to a sampling frequency 22. In this way, there is a shift 25 of interference amplitude 20—previously convoluted into base band 1—of high-frequency unfiltered interference signal 18 into a frequency range that is outside base band 1.

Here, the modification of sampling frequency 17 to sampling frequency 22 takes place successively, by a predetermined constant magnitude, in a direction always having the same sign, until interfering amplitude 20 of high-frequency unfiltered interference signal 18 is no longer recognized, i.e. is no longer convoluted into base band 1, but rather into a frequency range outside base band 1. In this case, modification 24 of sampling frequency 17 to decreased sampling frequency 22 is made up of a multiplicity of, for example n, determined constant modification steps, always in a direction having the same sign, which in FIG. 3 is negative. Here, the magnitude of modification 24 of sampling frequency 17, i.e. the magnitude of its increase or, as in the present case, decrease, can be limited by a threshold value 15 beyond which no further modification of the sampling frequency is carried out.

Threshold value 15 can be based on the aperture jitter of a sample and hold circuit used in the method, but can also be limited to a value of initial sampling frequency 17 increased or decreased by at most X %, which may be 1% or 5%. The dimensioning of the magnitude by which modification 24 of sampling frequency 17 to sampling frequency 22 takes place, successively and always in the same direction up to a maximum of threshold value 15, can for example also be carried out using the selected, or set, threshold value 15, via a formation rule in which the difference of threshold value 15 and the first sampling frequency is decomposed into n substeps.

Figure 4:
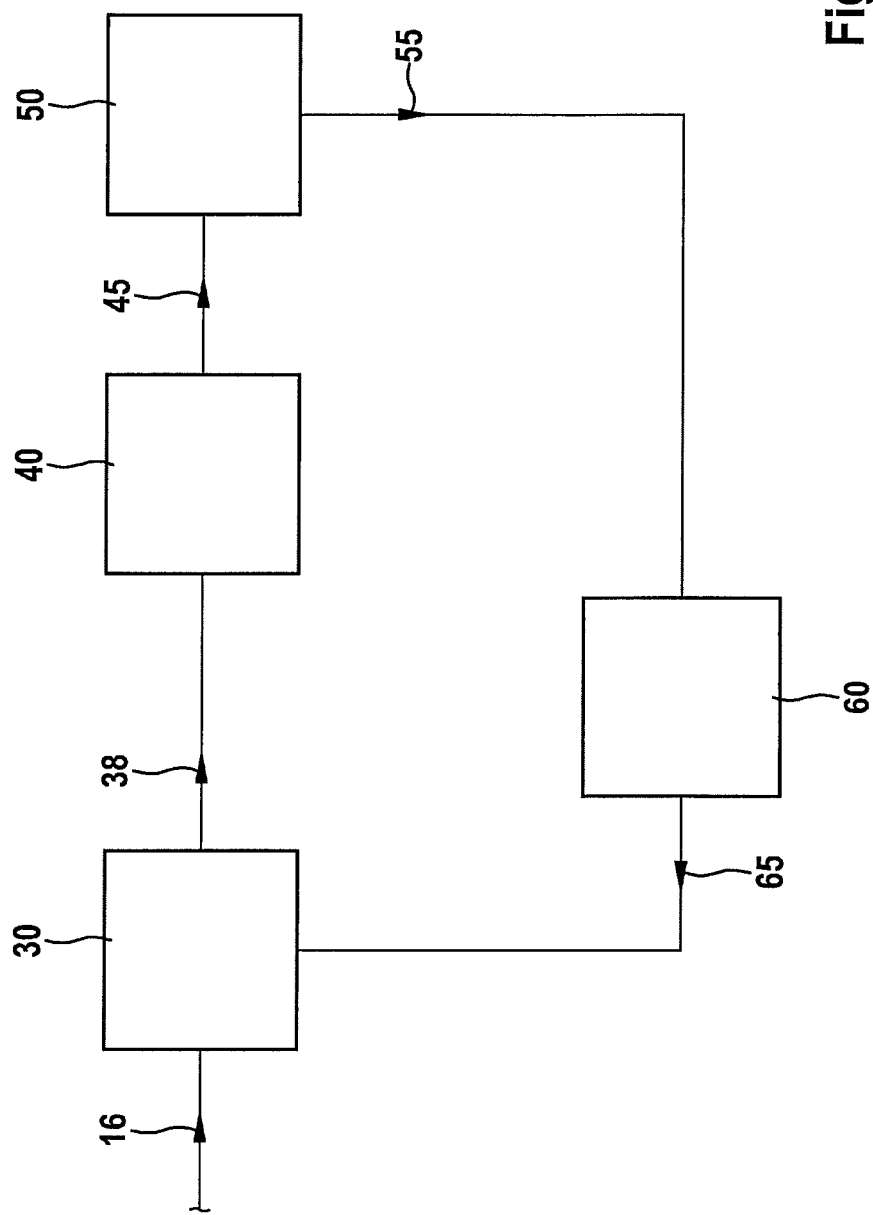
FIG. 4 shows the design of a device for carrying out the method according to the present invention.

FIG. 4 shows the design of a device for carrying out the method according to the present invention. Realized here is a clock pulse generator 60 that is configured to generate a periodic clock signal 65 and to modify the period of periodic clock signal 65 upon reception of a control signal 55. Periodic clock signal 65 is provided to a sampling unit 30 in which periodic clock signal 65 is used to sample an analog useful signal 16. Sampling unit 30 is in addition configured to generate a sampled useful signal 38 and to provide it to an analog-digital converter 40.

Analog-digital converter 40 is configured to convert sampled useful signal 38 into a digital useful signal 45 and to supply it to a unit 50 for determining interference amplitudes. This unit 50 for determining interference amplitudes determines whether digital useful signal 45 is affected by an interference amplitude 20, or whether an interference amplitude 20 is present. If an interference amplitude 20 is present, a control signal 55 is generated in unit 50 for determining interference amplitudes and is supplied to clock pulse generator 60, which thereupon modifies the period of periodic clock signal 65. If no interference amplitude 20 is present, no control signal 55 is generated. Sampling unit 30, analog-digital converter 40, unit 50 for determining interference amplitudes, and clock pulse generator 60 thus form a closed-loop control circuit.

In the device depicted here, clock pulse generator 60, sampling unit 30, analog-digital converter 40, and unit 50 for determining interference amplitudes are shown as separate units or components. These components can however be combined with one another in any manner, both spatially and functionally. Thus, purely as an example, both the sampling and the analog-digital conversion can take place in one element.

FIG. 5 shows a specific embodiment of a device for carrying out the method according to the present invention. Shown are an analog-digital converter 40 and a sampling unit 30, shown as a functional unit for analog-digital conversion 30, 40. Sampling unit 30 is realized here as a sample and hold circuit whose switching equipment and hold capacitor are shown schematically in FIG. 5. The functional unit for analog-digital conversion 30, 40 is connected to a unit 50 for determining interference amplitudes, which is realized in this exemplary embodiment as a digital part having a digital comparator. The digital part is in turn connected to a clock pulse generator 60, realized as an oscillator, while clock pulse generator 60 is connected to the functional unit for analog-digital conversion 30, 40.

Thus, a closed-loop control circuit is present via the functional unit for analog-digital conversion 30, 40, clock pulse generator 60, and unit 50 for determining interference amplitudes. In the oscillator, a periodic clock signal 65 is generated having period T and frequency f=1/T. This periodic clock signal 65 is provided to the sample and hold circuit and is used to open and close the switching equipment of the sample and hold circuit with frequency f. If in addition to periodic clock signal 65 an analog useful signal 16 is provided to the sample and hold circuit, this analog useful signal 16 is sampled with a first sampling frequency 17 that corresponds to the above-indicated frequency f, and is converted from analog to digital, likewise in the functional unit for analog-digital conversion 30, 40. At the output of the functional unit for analog-digital conversion 30, 40 there is present a digital useful signal 45 that is supplied to the digital part.

In the digital comparator of the digital part, digital useful signal 45 is compared to at least one reference value that corresponds for example to the value of the average amplitude of noise 3 of the upstream analog-digital conversion. If digital useful signal 45 is greater than the at least one reference value, then in the digital part a control signal 55, which may be for example a 10-bit trimming signal, is generated and is supplied to the oscillator. In this oscillator, the period of periodic clock signal 65 is then modified corresponding to control signal 55, to an increased or decreased sampling frequency 22. From the clock pulse curve shown schematically in FIG. 5 (at the functional block of the oscillator), it can be seen that sampling frequency 22 is greater than sampling frequency 17. The sampling frequency is adapted until digital useful signal 45 is smaller than the at least one reference value of the digital comparator of digital part 50, or until a specified threshold value 15 of the maximum frequency modification has been reached.

In all exemplary embodiments, upon the reaching of the threshold value 15, for example an initial sampling frequency 17 increased by X %, the method can be restarted with an initial sampling frequency 17 decreased by X %, so that, despite the presence of an interference amplitude 20 in basis been 1, the sampling frequency is continuously modified in a loop. Upon reaching a threshold value 15 of, for example, an initial sampling frequency 17 decreased by X %, the method correspondingly begins at an initial sampling frequency 17 increased by X %.

What is claimed is:

1. A method for providing interference suppression of a sampling process, the method comprising:
    sampling an analog useful signal with a sampling frequency f;
    providing analog-digital conversion of the sampled useful signal;
    determining whether an interference amplitude is present, an interferences amplitude being determined to be present only if it is greater than the noise of the analog-digital conversion performed in connection with the method and if the interference amplitude is present in the base band of the frequency spectrum of the sampled useful signal, the base band extending across a frequency range from 0*f to f/2;
    increasing or decreasing the sampling frequency f if an interference amplitude is present, then beginning anew with the sampling of the analog useful signal with the increased or decreased sampling frequency;
    wherein the increasing or decreasing of the sampling frequency f is performed successively by a predetermined, constant absolute value $\Delta f$ in a direction having always the same sign, up to a threshold value $f_g$.

2. The method of claim 1, wherein $\Delta f$ is formed according to the following rule containing threshold value $f_G$: $f_{increased/decreased}=f+\Delta f$, where $\Delta f=(f_g-f_{1,0})/n$, $n\epsilon Z$, and $f_{1,0}$ is the initial sampling frequency.

3. The method of claim 2, wherein n is selected from a subset of the whole numbers M, where $M\epsilon[1, 20]$.

4. The method of claim 1, wherein the threshold value $f_G$ is defined through the value of the aperture jitter of a sample and hold circuit used in the context of the sampling process.

5. The method of claim 1, wherein the threshold value $f_G$ corresponds at most to the initial sampling frequency increased or decreased by 5%.

6. The method of claim 1, wherein the threshold value $f_G$ corresponds at most to the initial sampling frequency increased or decreased by 1%.

7. A device, comprising:
a clock pulse generator to produce a periodic clock signal and to modify a period of the periodic clock signal upon reception of a control signal;
a sampling unit to use the periodic clock signal as a sampling frequency f for the sampling of an analog useful signal and to produce a sampled useful signal;
an analog-digital converter to convert the sampled useful signal into a digitally useful signal;
an interference amplitude determination unit to determine whether the digitally useful signal is affected by an interference amplitude, an interference amplitude being determined to be present only if it is greater than the noise of the performed analog-digital conversion and if the interference amplitude is present in the base band of the frequency spectrum of the sampled useful signal, the base band extending across a frequency range from 0*f to f/2;
wherein if an interference amplitude is present, the interference amplitude determination unit generates a control signal and supplies it to the clock pulse generator so that a change in the sampling frequency f in the sampling unit occurs successively, by a predetermined constant absolute value Δf in a direction having always the same sign, up to a threshold value $f_g$.

8. The device of claim 7, wherein Δf is formed according to the following rule containing threshold value $f_G$: $f_{increased/decreased} = f + \Delta f$, where $\Delta f = (f_g - f_{1,0})/n$, n∈Z, and $f_{1,0}$ is the initial sampling frequency.

9. The device of claim 8, wherein n is selected from a subset of the whole numbers M, where M∈[1, 20].

10. The device of claim 7, wherein the threshold value $f_G$ is defined through the value of the aperture jitter of a sample and hold circuit used in the context of the sampling process.

11. The device of claim 7, wherein the threshold value $f_G$ corresponds at most to the initial sampling frequency increased or decreased by 5%.

12. The device of claim 7, wherein the threshold value $f_0$ corresponds at most to the initial sampling frequency increased or decreased by 1%.

* * * * *